(12) United States Patent
Chung et al.

(10) Patent No.: US 7,144,747 B2
(45) Date of Patent: Dec. 5, 2006

(54) METHOD FOR THERMALLY TREATING A SUBSTRATE THAT COMPRISES SEVERAL LAYERS

(75) Inventors: Hin Yiu Chung, Elchingen (DE); Georg Roters, Dülmen (DE)

(73) Assignee: Mattson Thermal Products GmbH (DE)

( * ) Notice: Subject to any disclaimer, the term of this patent is extended or adjusted under 35 U.S.C. 154(b) by 347 days.

(21) Appl. No.: 10/487,573

(22) PCT Filed: Jul. 26, 2002

(86) PCT No.: PCT/EP02/08310

§ 371 (c)(1),
(2), (4) Date: Feb. 18, 2004

(87) PCT Pub. No.: WO03/019625

PCT Pub. Date: Mar. 6, 2003

(65) Prior Publication Data

US 2004/0209483 A1     Oct. 21, 2004

(30) Foreign Application Priority Data

Aug. 20, 2001 (DE) ............................... 101 40 791

(51) Int. Cl.
*H01L 21/00* (2006.01)

(52) U.S. Cl. ..................... 438/22; 438/48; 438/767; 438/E21.301; 438/E21.559; 372/96; 257/98

(58) Field of Classification Search ............... 438/22, 438/48; 257/98; 372/96
See application file for complete search history.

(56) References Cited

U.S. PATENT DOCUMENTS

| 5,262,360 | A | 11/1993 | Holonyak, Jr. et al. |
| 5,872,031 | A | 2/1999 | Mishra et al. |
| 6,014,400 | A | 1/2000 | Kobayashi |
| 6,370,179 | B1 * | 4/2002 | Deppe et al. .................. 372/96 |
| 6,529,541 | B1 * | 3/2003 | Ueki et al. ..................... 372/96 |
| 6,949,473 | B1 * | 9/2005 | Biard et al. .................. 438/759 |

FOREIGN PATENT DOCUMENTS

| DE | 19905524 | 9/2000 |
| DE | 10053025 | 5/2001 |

OTHER PUBLICATIONS

Article, "Lateral oxidation of AlAs layers at elevated water vapour pressure using a closed-chamber system".

(Continued)

*Primary Examiner*—Dung A. Le
(74) *Attorney, Agent, or Firm*—Dority & Manning, P.A.

(57) ABSTRACT

A method of thermally treating a substrate that has multiple layers is provided. A substrate layer that is covered on opposite sides is oxidized from side edges thereof toward a center thereof such that, via the following steps, a defined central portion is not oxidized. The substrate is heated in a process chamber to a prescribed treatment temperature. A hydrogen-rich water vapor is introduced into the process chamber for a specified period of time, wherein such introduction is effected prior to, during and/or after the step of heating the substrate to the prescribed temperature. After conclusion of the specified period of time, introduced into the process chamber is one of the group consisting of: dry oxygen, namely pure oxygen in the form of at least one of atomic O, molecular $O_2$ and $O_3$; a mixture of oxygen and an inert gas that does not chemically react with the layers of the substrate; an oxygen-containing compound that contains no water; and an oxygen-rich water vapor.

16 Claims, 3 Drawing Sheets

OTHER PUBLICATIONS

Article High Reliable, Low Threshold 1.3 μm SL-QW PACIS Laser Array.

Article, "Single Mode AlGaAs-GaAs Lasers Using Lateral Confinement by Native-Oxide Layers".

* cited by examiner

METHOD FOR THERMALLY TREATING A SUBSTRATE THAT COMPRISES SEVERAL LAYERS

BACKGROUND OF THE INVENTION

The present invention relates to the thermal treatment of a substrate having multiple layers, according to which a substrate layer that is covered from above and below is oxidized from the side edges thereof toward the center.

Such a method is known, for example, during the production of an aperture for surface emitting semiconductor lasers having a vertical resonator, which is also designated as a Vertical Cavity Surface Emitting Laser (VCSEL). A VCSEL is a semiconductor laser in which the radiation that is produced is propagated vertically, i.e. in a direction perpendicular to the semiconductor surface and a p-n-junction plane. With conventional lasers, the propagation of the radiation is effected in a direction parallel to the semiconductor surface and the p-n-junction plane. VCSEL's are used as the preferred light sources for large parallel optical communication architectures. To enable a coupling of the VCSEL's with optical fibers, they must emit a Gaussian radiation profile. For the Gaussian radiation profile, and for a laser activation, a special circular aperture is necessary in the VCSEL, and it must be defined precisely.

In the past, this aperture was formed by an oxidation of AlGaAs structures of the VCSEL's that progressed from the side. For the oxidation, the VCSEL's in a process chamber were brought to a treatment temperature and were oxidized with a nitrogen-containing water vapor. After the oxidation, the VCSEL's in the process chamber were cooled in an inert gas atmosphere to a temperature lower than the process temperature, and they were subsequently removed from the process chamber. In order to increase the throughput, with many VCSEL processes, the substrates are already removed from the process chamber at process temperatures, with the cooling of the substrates then generally being effected in ambient air.

The oxidation from the side, as is known for example from U.S. Pat. No. 6,014,400, is initiated by the nitrogen-containing water vapor treatment, and an oxidation front is formed that proceeds from the outside toward the interior. During the cooling-off in inert gas atmospheres, and during removal of the wafers from the process chamber, or during the cooling-off of the substrates having VCSEL structures in ambient air, a progression of the oxidation is gradually retarded and is brought to a stop. This retardation and stopping of the progress of the oxidation front can, however, not be precisely controlled with the above-mentioned method, so that it is not possible to form a good and predictable aperture.

For good optical properties of the VCSEL's, especially for the formation of a desired spatial radiation profile, such as for example a Gaussian radiation profile, a precise aperture formation is, however, necessary.

Proceeding from the above described state of the art, it is therefore an object of the present invention to provide a method with which a laterally progressing oxidation of a layer of a multi-layer substrate is possible such that a defined central portion is not oxidized, i.e. that a progression of the lateral oxidation can be stopped at a specified point.

SUMMARY OF THE INVENTION

Pursuant to the present invention, this object is realized by a method for the thermal treatment of a substrate, especially a semiconductor wafer, that has multiple layers, according to which a substrate layer that is covered from above and below is oxidized from the side edges thereof toward the center in such a way that a defined central portion is not oxidized, whereby the substrate is heated in a process chamber to a prescribed treatment temperature, a hydrogen-rich water vapor is introduced into the process chamber for a specified period of time, and after conclusion of the specified period of time, dry oxygen, or an oxygen-rich water vapor, is introduced into the process chamber. As a result of the heating of the substrate to the treatment temperature, and the introduction of a hydrogen-rich water vapor, it is possible to achieve a controlled, laterally progressing oxidation of a substrate layer that is covered from above and below. By the subsequent introduction of dry oxygen or an oxygen-rich water vapor into the process chamber, it is possible to stop the lateral progression of the oxidation in a defined manner in order to achieve a defined, non-oxidized central portion. Dry oxygen includes not only pure oxygen (in the form of atomic O and/or molecular $O_2$ and/or $O_3$), but also a mixture of oxygen and an inert gas such as, for example, nitrogen or argon, whereby the inert gas is distinguished by the fact that it does not chemically react with the layers of the substrate. Furthermore, dry oxygen also includes oxygen-containing compounds that contain no water.

Pursuant to a preferred embodiment of the invention, between the introduction of the hydrogen-rich water vapor and the introduction of the dry oxygen or the oxygen-rich water vapor, a further gas is introduced into the process chamber in order to displace the hydrogen-rich water vapor out of the process chamber. This prevents an explosive or detonating gas of hydrogen and oxygen from forming in the process chamber, which due to the increased temperature of the process chamber and of the substrate could lead to the danger of an explosion. In this connection, the further gas contains neither hydrogen nor oxygen. The further gas is preferably an inert gas in order to avoid undesired reactions with the substrate during this rinsing step.

For a good and controllable, laterally progressing oxidation of the layer that is to be oxidized, the substrate is preferably heated to a treatment temperature of between 300 C. and 700 C.

Pursuant to a particularly preferred embodiment of the invention, the substrate is provided with a semiconductor wafer having an AlGaAs structure, which is suitable, for example, for the formation of VCSEL's. In this connection, the layer that is to be oxidized is preferably an aluminum-containing layer (abbreviated in the following as an aluminum layer). With the aluminum layer, during the introduction of the dry oxygen or the oxygen-rich water vapor, sapphire is formed that suppresses the lateral progression of the oxidation front.

Advantageously at least one of the plurality of layers forms a preferably round truncated cone, whereby the layer that is to be oxidized is disposed in the region of the truncated cone. This allows a well-defined, round, non-oxidized central portion of the layer that is to be oxidized to be achieved.

Pursuant to the preferred embodiment of the invention, the non-oxidized central portion of the layer that is to be oxidized forms an aperture for a Vertical Cavity Surface Emitting Laser (VCSEL). In this connection, the aperture is preferably round in order to achieve a good activation of the laser and a Gaussian irradiation profile.

The temperature of the substrate during the introduction of the hydrogen-rich water vapor and of the dry oxygen or the oxygen-rich water vapor is preferably held at the treatment temperature in order to enable a defined progression of the oxidation front and a controlled halting or stopping of the oxidation front. For an acceleration of the method, the substrate is preferably removed from the process chamber directly after the step c), which is possible since the oxidation front was halted in a controlled manner by the introduction of the dry oxygen or the oxygen-rich water vapor. A controlled cooling-off of the substrate in the process chamber is therefore no longer necessary.

The introduction of the hydrogen-rich water vapor can be effected prior to, during and/or after the heating of the substrate to the prescribed treatment temperature, whereby during thermal treatments in rapid heating units (RTP units), the introduction is, however, advantageously effected prior to the heating in order to provide conditions for the laterally progressing oxidation that are defined as precisely as possible.

BRIEF DESCRIPTION OF THE DRAWINGS

The invention will be explained in greater detail subsequently with the aid of a preferred embodiment of the invention with reference to the drawing. In the drawing.

DESCRIPTION OF THE PREFERRED EMBODIMENTS.

Figure 1:
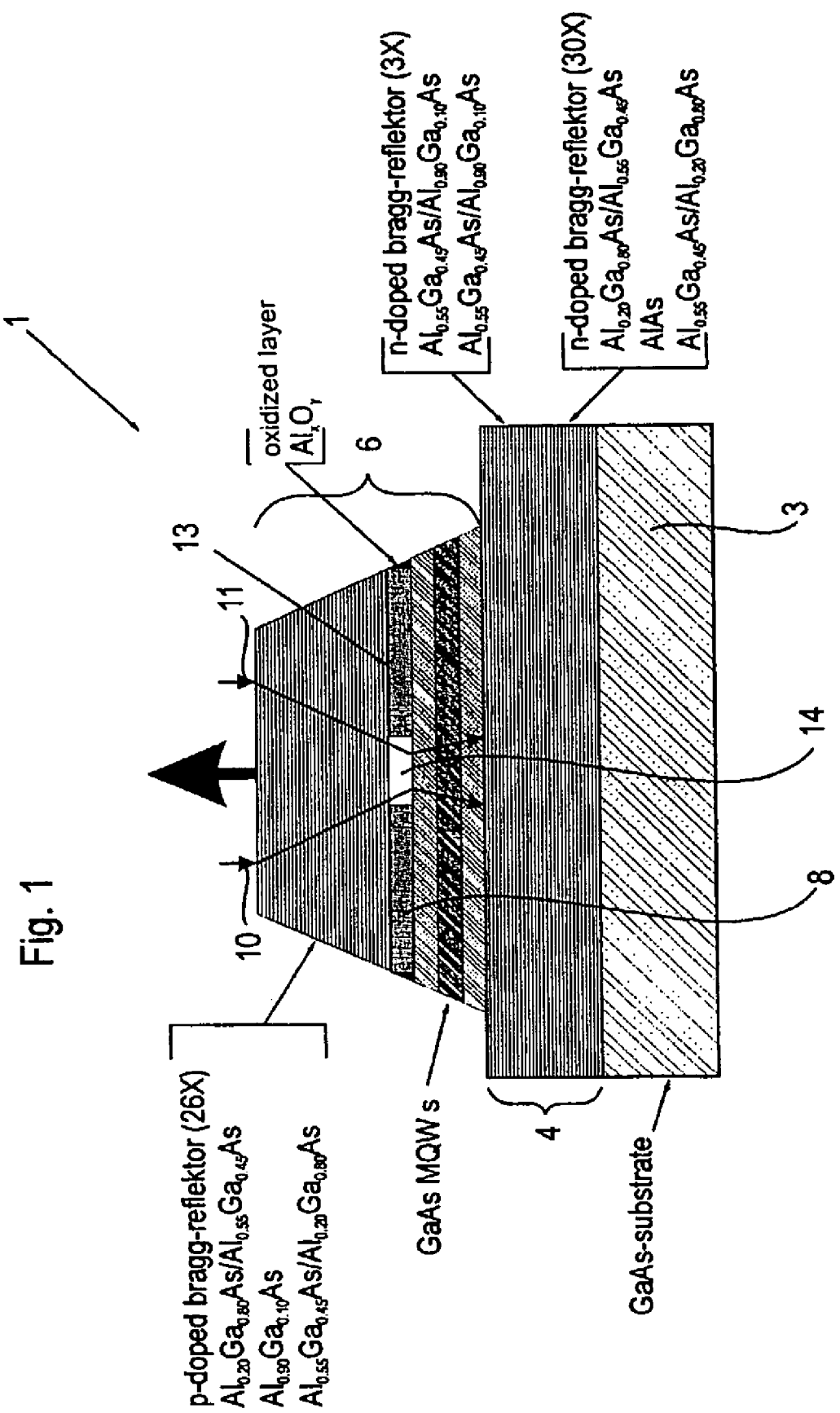
FIG. 1 shows a cross-sectional view of an AlGaAs semiconductor structure for a Vertical Cavity Surface Emitting Laser (VCSEL)

FIG. 1 shows a schematic cross-sectional view through the arrangement of an AlGaAs structure for a Vertical Cavity Surface Emitting Laser 1, the light exiting aperture of which is produced pursuant to the method of the present invention.

The laser has a GaAs substrate on which is applied a first plurality of n-doped AlGaAs layers. The first plurality of layers is applied to the GaAs substrate in a region 4, and the layers have essentially the same peripheral dimensions as does the GaAs substrate 3. Beyond the region 4, the dopings of the layers vary, as indicated in FIG. 1.

In a further section 6, a second plurality of layers is applied to the first plurality of layers. In the second section or region 6, the plurality of layers are applied or processed in such a way that they form a round truncated cone or a mesa, i.e. a layer structure that projects beyond the substrate.

Adjacent to the region or section 4 having the first plurality of layers first GaAsMQW layers are provided. This is followed by an aluminum layer 8 on which is then provided a plurality of p-doped AlGaAs layers. Provided on the upper surface of the truncated cone are electrical connections or terminals for the activation of the laser, as illustrated by the arrows 10, 11.

The aluminum layer 8 has an oxidized outer portion 13, which is illustrated as dark-colored, as well as a non-oxidized central portion 14 that is illustrated as light-colored and serves as an aperture for the laser. For a good laser activation, and for a good coupling of the laser to optical fibers, it is important that the non-oxidized central portion 14 form a round aperture that is defined as precisely as possible.

Such a precisely defined round aperture can be produced by the inventive method, which is described subsequently.

To form the oxidized outer portion 13, an AlGaAs structure having the aforementioned build-up, in which the aluminum layer 8 is present in a continuous non-oxidized state, is loaded into a process chamber of a thermal treatment unit. The thermal treatment unit is, for example, a rapid heating unit, such as is known from DE-A-199 05 524, which originates from this same applicant, and which to this extent is made the subject matter of the present invention in order to avoid repetition.

The temperature of the AlGaAs structure is subsequently heated to a treatment temperature of between 300 and 700 C., which is advantageous for a good and defined oxidation of the aluminum layer 8. After the heating of the structure, a hydrogen-rich water vapor is introduced into the process chamber of the heating unit. The hydrogen-rich water vapor can be produced, for example, by conducting hydrogen through water vapor. Alternatively, the hydrogen-rich water vapor mixture can also be produced by the burner, which will be described subsequently with reference to FIGS. 2 and 3.

As a result of the introduction of the hydrogen-rich water vapor, the following chemical reactions occur within the process chamber:

$$2AlAs + 3H_2O = Al_2O_3 + 2AsH_3$$

$$AlAs + 2H_2O = AlO(OH) + AsH_3$$

$$AlO(OH) + AlAs + H_2O = Al_2O_3 + 2AsH_3$$

$$AlAs + 3H_2O = Al(OH)_3 + AsH_3$$

$$Al(OH)_3 + AlAs = Al_2O_3 + AsH_3$$

$$2AlAs + 6H_2O = Al_2O_3 + As_2O_3 + 6H_2$$

$$As_2O_3 + 6H_2 = 2AsH_3 + 3H_2O$$

In this connection, there occurs a laterally proceeding oxidation of the aluminum layer, which progresses from the side edges of the layers 8 toward the inside. The lateral velocity of the oxidation is known, and after achieving a certain progress of the oxidation, i.e. after termination of a certain period of time, the introduction of the hydrogen-rich water vapor is halted. The process chamber is subsequently rinsed with a gas, preferably an inert gas, in order to displace the hydrogen out of the process chamber. Nitrogen and/or noble gases such as argon are preferably used as inert gases.

After the process chamber is rinsed with the inert gas, dry oxygen or oxygen-rich water vapor is introduced into the process chamber. As a result of the introduction of the dry oxygen or of the oxygen-rich water vapor, the following chemical reaction occurs:

$$4AlAs + 5O_2 = 2Al_2O_3 + 4AsO \text{ or}$$

$$2AlAs + 3O_2 = Al_2O_3 + As_2O_3$$

In this way, an advancing of the oxidation front by passivation of the oxide layer is achieved. Thus, the advancing of the oxidation front, and the formation of the non-oxidized aperture 14, can be precisely controlled in order to form a defined edge region of the aperture for the laser.

Instead of the rinsing step with an inert gas described above, it is also possible, for the rinsing of the process chamber, to introduce another gas, or for example pure water vapor, into the process chamber in order after the displacement of the hydrogen-rich water vapor to introduce the dry oxygen or oxygen-rich water vapor. The displacement of the hydrogen prior to the introduction of oxygen is necessary in order to prevent the formation of an oxyhydrogen or explosive gas mixture in the process chamber.

Figure 2:
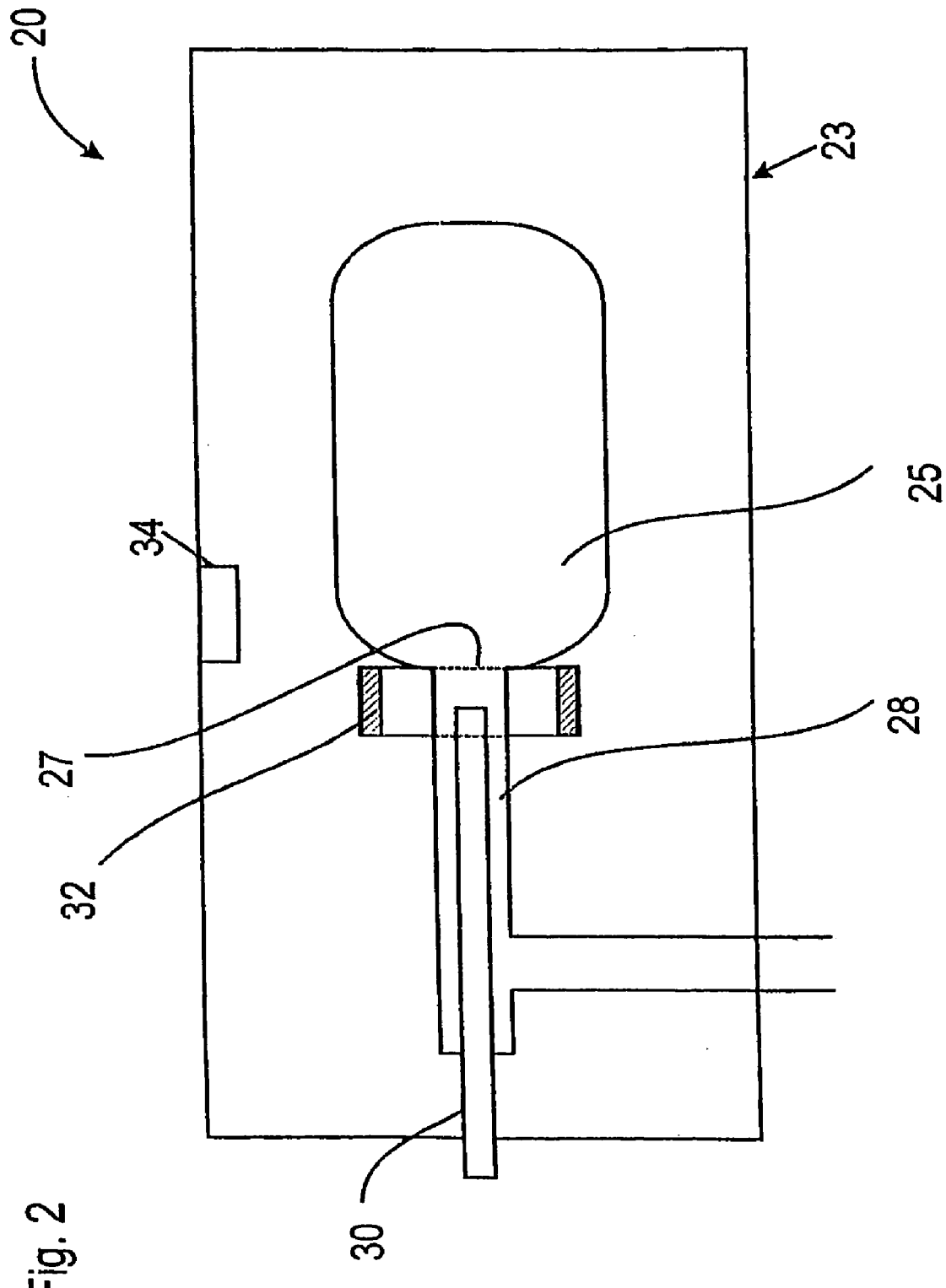
FIG. 2 shows a schematic cross-sectional illustration through a burner for the provision of a water vapor that contains hydrogen or oxygen.
Figure 3:
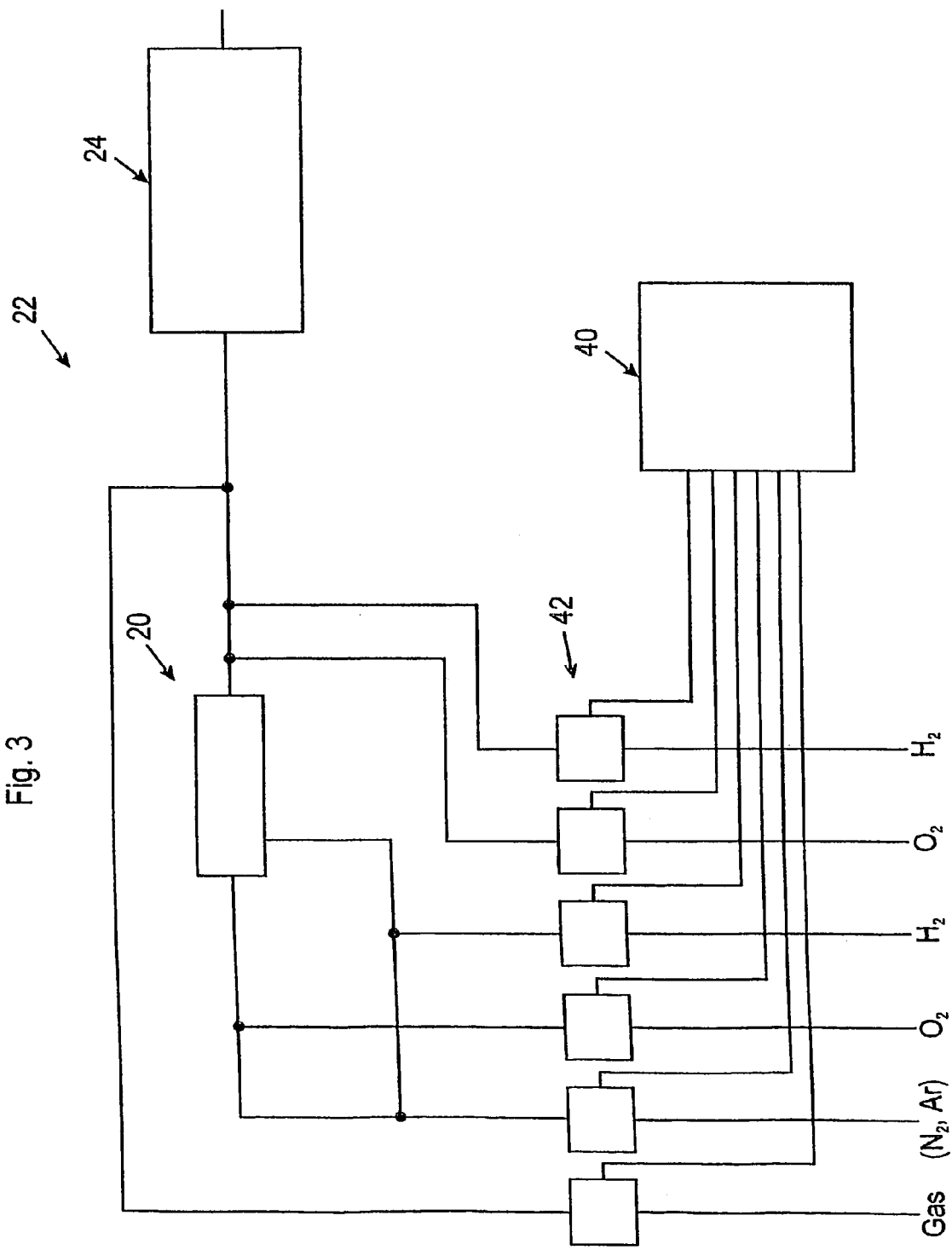
FIG. 3 shows a schematic block diagram of a substrate treatment apparatus for carrying out the inventive method.

The hydrogen-rich water vapor and/or the oxygen-rich water vapor can be produced with a burner 20, which is schematically illustrated in the cross-section of FIG. 2. FIG. 3 schematically shows, in a block diagram, an entire unit 22 that is suitable for carrying out the above-described method, and which contains the burner 20 of FIG. 2 as well as a thermal treatment unit 24.

The burner 20 and the unit 22 have, for example, a composition such as is described in the not pre-published German Patent Application No. 101 19 741 that originates with the same applicant and has the title "Method and Apparatus for the Production of Process Gases" dated 23 Apr. 2001, and which to this extent is made the subject matter of the present invention in order to avoid repetition.

In summary, the burner 20 has a housing 23 with a combustion chamber 25. The combustion chamber 25 has an inlet 27 that is in communication with first and second gas inlet lines 28, 30. By means of the inlet lines 28, 30, oxygen or hydrogen can respectively be introduced into the combustion chamber 25 in a controlled manner. In the region of the inlet 27, a heating ring 32 that surrounds the inlet lines 28, 30 is provided in order to heat the gases introduced via the inlet lines 28, 30 and to effect a combustion of the thereby resulting explosive or detonating mixture of hydrogen and oxygen. The combustion is monitored by an appropriate flame sensor 34. During the combustion, water vapor results by the stoichiometric combustion of substituents of the resulting oxygen/hydrogen gas mixture. If one of the substituents is present in greater than a stoichiometric proportion, there results an oxygen-rich or hydrogen-rich water vapor mixture that can be introduced into the thermal treatment unit 24 of FIG. 3 for a thermal treatment of the VCSEL 1.

By increasing the oxygen or hydrogen content, one can alternate between an oxygen-rich and a hydrogen-rich water vapor mixture, whereby during the switching one must take care that no explosive mixture results outside of the burner. This can be achieved, for example, in that, for example after the production of an oxygen-rich water vapor mixture, for a certain period of time stoichiometric proportions of oxygen and hydrogen are introduced into the burner in order to ensure a complete combustion and to displace the excess oxygen out of the burner. Only subsequent thereto is additional hydrogen introduced into the burner in order to now produce a hydrogen-rich water vapor mixture.

Alternatively, the burner can, of course, also be rinsed in the meantime with an inert gas that can also be simultaneously used for rinsing the thermal treatment unit 24.

As can be recognized in FIG. 3, the entire unit 22, which is used for the thermal treatment process of the present invention, has a control unit 40 that via appropriate valves 42 controls the supply of various gases into the burner 20 or a connecting line between the burner 20 and the thermal treatment unit 24. By introducing oxygen or hydrogen into a connecting line between the burner 20 and the thermal treatment unit 24, it is possible to precisely set the oxygen or hydrogen content of the oxygen-rich or hydrogen-rich water vapor mixture.

The invention was previously described with the aid of preferred embodiments without being limited to the concretely illustrated embodiments. For example, for the production of an oxygen-rich or hydrogen-rich water vapor mixture, it is not necessary to use a burner pursuant to FIG. 2. Rather, the mixture could also be produced by evaporating water and introducing oxygen or hydrogen into the vapor. Furthermore, the inventive method for treating a substrate having multiple layers can also be carried out at any desired process chamber pressure. For example, the method can be carried out in RTP units at normal pressure (atmospheric pressure), overpressure or underpressure. At a suitable underpressure and chamber design, a possible explosion pressure of a possible explosive gas explosion can be reduced to such an extent that no damage occurs to the chamber or substrate. In this way, a possible switching between hydrogen-rich and oxygen-rich water vapor (or vice versa) is possible without the chamber being rinsed by an inert gas or pure water vapor for avoiding an explosive gas mixture.

The specification incorporates by reference the disclosure of PCT/EP02/08310 filed Jul. 26, 2002 and German priority document 101 40 791.2 filed Aug. 20, 2001.

The present invention is, of course, in no way restricted to the specific disclosure of the specification and drawings, but also encompasses any modifications within the scope of the appended claims.

The invention claimed is:

1. A method of thermally treating a substrate that has multiple layers, wherein a substrate layer that is covered on opposite sides is oxidized from side edges thereof toward a center thereof such that, via the following steps, a defined central portion is not oxidized:
   heating the substrate, in a process chamber, to a prescribed treatment temperature;
   introducing a hydrogen-rich water vapor into the process chamber for a specified period of time, wherein such introduction is effected prior to, during and/or after said step of heating the substrate to the prescribed treatment temperature; and
   introducing into the process chamber, after conclusion of the specified period of time, one of the group consisting of: dry oxygen, namely pure oxygen in the form of at least one of atomic O, molecular $O_2$ and $O_3$; a mixture of oxygen and an inert gas that does not chemically react with the layers of the substrate; an oxygen-containing compound that contains no water; and an oxygen-rich water vapor.

2. A method according to claim 1, which includes a further step, between said introducing steps, of introducing a further gas into the process chamber to displace hydrogen-rich water vapor out of the process chamber.

3. A method according to claim 2, wherein said further gas contains neither hydrogen nor oxygen.

4. A method according to claim 2, wherein said further gas is an inert gas.

5. A method according to claim 1, wherein said substrate is heated to a treatment temperature of between 300 and 700° C.

6. A method according to claim 1, wherein the substrate comprises a semi-conductor wafer having a III–V semiconductor structure.

7. A method according to claim 6, wherein said structure is an AlGaAs structure or an InAlAs structure.

8. A method according to claim 6, wherein the layer that is to be oxidized is a layer containing aluminum.

9. A method according to claim 1, wherein at least some of the multiple layers form a truncated cone.

10. A method according to claim 9, wherein said truncated cone is round.

11. A method according to claim 9, wherein the layer that is to be oxidized is disposed in the region of the truncated cone.

12. A method according to claim 1, wherein the central portion that is not oxidized forms an aperture for a surface-emitting semiconductor having a vertical resonator, which is also designated as Vertical Cavity Surface Emitting Laser.

13. A method according to claim 12, wherein the aperture is round.

14. A method according to claim 1, wherein during the introducing steps, the substrate is held at the prescribed treatment temperature.

15. A method according to claim 1, wherein immediately after the step of introducing one of the group consisting of: dry oxygen, namely pure oxygen in the form of at least one of atomic O, molecular $O_2$ and $O_3$; a mixture of oxygen and an inert gas that does not chemically react with the layers of the substrate; an oxygen-containing compound that contains no water; and an oxygen-rich water vapor, the substrate is removed from the process chamber.

16. A method according to claim 1, wherein the process chamber is operated at underpressure.

\* \* \* \* \*